United States Patent
Tamiya

(10) Patent No.: US 9,857,423 B2
(45) Date of Patent: Jan. 2, 2018

(54) DEBUGGING CIRCUIT, DEBUGGER DEVICE, AND DEBUGGING METHOD

(71) Applicant: FUJITSU LIMITED, Kawasaki-shi, Kanagawa (JP)

(72) Inventor: Yutaka Tamiya, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 99 days.

(21) Appl. No.: 14/724,052

(22) Filed: May 28, 2015

(65) Prior Publication Data
US 2016/0054388 A1 Feb. 25, 2016

(30) Foreign Application Priority Data
Aug. 22, 2014 (JP) ................. 2014-169042

(51) Int. Cl.
G06F 11/26 (2006.01)
G01R 31/317 (2006.01)
G06F 11/36 (2006.01)

(52) U.S. Cl.
CPC ........ G01R 31/31705 (2013.01); G06F 11/36 (2013.01)

(58) Field of Classification Search
USPC ........................................... 714/52
See application file for complete search history.

(56) References Cited

U.S. PATENT DOCUMENTS

| | | | |
|---|---|---|---|
| 6,389,557 B1* | 5/2002 | Yu | G06F 9/4418 711/112 |
| 6,760,864 B2* | 7/2004 | Wood | G06F 11/364 714/30 |
| 6,785,884 B1* | 8/2004 | Rieschl | G06F 11/3664 714/38.13 |
| 6,922,821 B1* | 7/2005 | Nemecek | G06F 11/261 703/13 |
| 7,076,420 B1* | 7/2006 | Snyder | G06F 11/3656 703/28 |
| 8,103,496 B1* | 1/2012 | Roe | G06F 11/3652 703/23 |
| 8,402,313 B1* | 3/2013 | Pleis | G06F 11/273 714/30 |
| 8,423,829 B2* | 4/2013 | Yamagata | G01R 31/31705 714/33 |
| 8,499,270 B1* | 7/2013 | Best | G06F 17/5054 716/116 |
| 2005/0257089 A1 | 11/2005 | Williams et al. | |

(Continued)

FOREIGN PATENT DOCUMENTS

| JP | 2005-317023 | 11/2005 |
|---|---|---|
| WO | 2008/020513 | 2/2008 |

Primary Examiner — Kamini Patel
(74) Attorney, Agent, or Firm — Fujitsu Patent Center

(57) ABSTRACT

A debugging circuit including: a storage configured to store a first code value which is calculated by an encoding method in which a value is changed according to a sequence of a signal in a debugging target circuit, and indicates a stop condition of the debugging target circuit; a code value calculator configured to calculate a second code value by the encoding method based on the signal each time when the signal is changed; and an operation stopper configured to stop an operation of the debugging target circuit when the first code value and the second code value are identical to each other.

15 Claims, 10 Drawing Sheets

(56) References Cited

U.S. PATENT DOCUMENTS

| | | | |
|---|---|---|---|
| 2006/0059404 A1* | 3/2006 | Cavanna | H03M 13/00 714/758 |
| 2007/0220391 A1* | 9/2007 | Han | G06F 11/3656 714/742 |
| 2009/0249122 A1* | 10/2009 | Nadehara | G06F 11/3648 714/34 |
| 2015/0121346 A1* | 4/2015 | Patel | G06F 11/3664 717/125 |

* cited by examiner

FIG. 6

```
1 module DUT(input ck,
2   input [15:0] x, output [15:0] y) ;
3   reg s = 0 ;
4   assign y = (s==0) ? 0 : 2*x ;
5   always @ (posedge ck)
6     case (s)
7     0 : if (x == 16'h0010)
8         s<=1 ;
9     1 : if (x == 16'h0030)
10        s<=0 ; //BreakPoint
11    endcase
12 endmodule
```

FIG. 8

| INPUT DATA x | SIGNAL s (INTERNAL STATE) | OUTPUT DATA y | CRC VALUE | STOP CONDITION |
|---|---|---|---|---|
| (INITIAL STATE) | 0 | | 32'h00000000 | NOT SATISFIED |
| 16'h0010 | 0 | 16'h0000 | 32'h715d8883 | NOT SATISFIED |
| 16'h0020 | 1 | 16'h0040 | 32'h49d20e79 | NOT SATISFIED |
| 16'h0030 | 1 | 16'h0060 | 32'h1435d0af | SATISFIED |
| 16'h0040 | 0 | 16'h0000 | 32'h9a3aad89 | NOT SATISFIED |

DEBUGGING CIRCUIT, DEBUGGER DEVICE, AND DEBUGGING METHOD

CROSS-REFERENCE TO RELATED APPLICATION

This application is based upon and claims the benefit of priority from the prior Japanese Patent Application No. 2014-169042 filed on Aug. 22, 2014, the entire contents of which are incorporated herein by reference.

FIELD

The embodiments discussed herein are related to a debugging circuit, a debugger device, and a debugging method.

BACKGROUND

In a logic analyzer technique which is an actual debugging tool adapted to confirm whether a hardware is normally operated, a debugging circuit is inserted when a debugging target circuit is implemented.

Related technologies are disclosed in, for example, Japanese Laid-Open Patent Publication No. 2005-317023 and International Publication Pamphlet No. WO 2008/020513.

SUMMARY

According to one aspect of the embodiments, a debugging circuit including: a storage configured to store a first code value which is calculated by an encoding method in which a value is changed according to a sequence of a signal in a debugging target circuit, and indicates a stop condition of the debugging target circuit; a code value calculator configured to calculate a second code value by the encoding method based on the signal each time when the signal is changed; and an operation stopper configured to stop an operation of the debugging target circuit when the first code value and the second code value are identical to each other.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 6 is a diagram illustrating an example of a debugging target;

FIG. 8 is a diagram illustrating an example of a stop condition;

DESCRIPTION OF EMBODIMENTS

A debugging circuit, for example, monitors a temporal change in a signal of a debugging target circuit designated by a user. When a value of the signal becomes identical to a stop condition, the debugging circuit stops an operation of the debugging target circuit and outputs the monitored temporal change of the signal stored in a trace memory to, for example, a display device.

In debugging of software, a breakpoint is used and thus a program is stopped under various conditions. However, in debugging of hardware, hardware may not be stopped under a condition or at a timing intended by the user due to the hardware constraints such as a capacity of a trace memory or the number of signal lines capable of being used in debugging.

Figure 1:
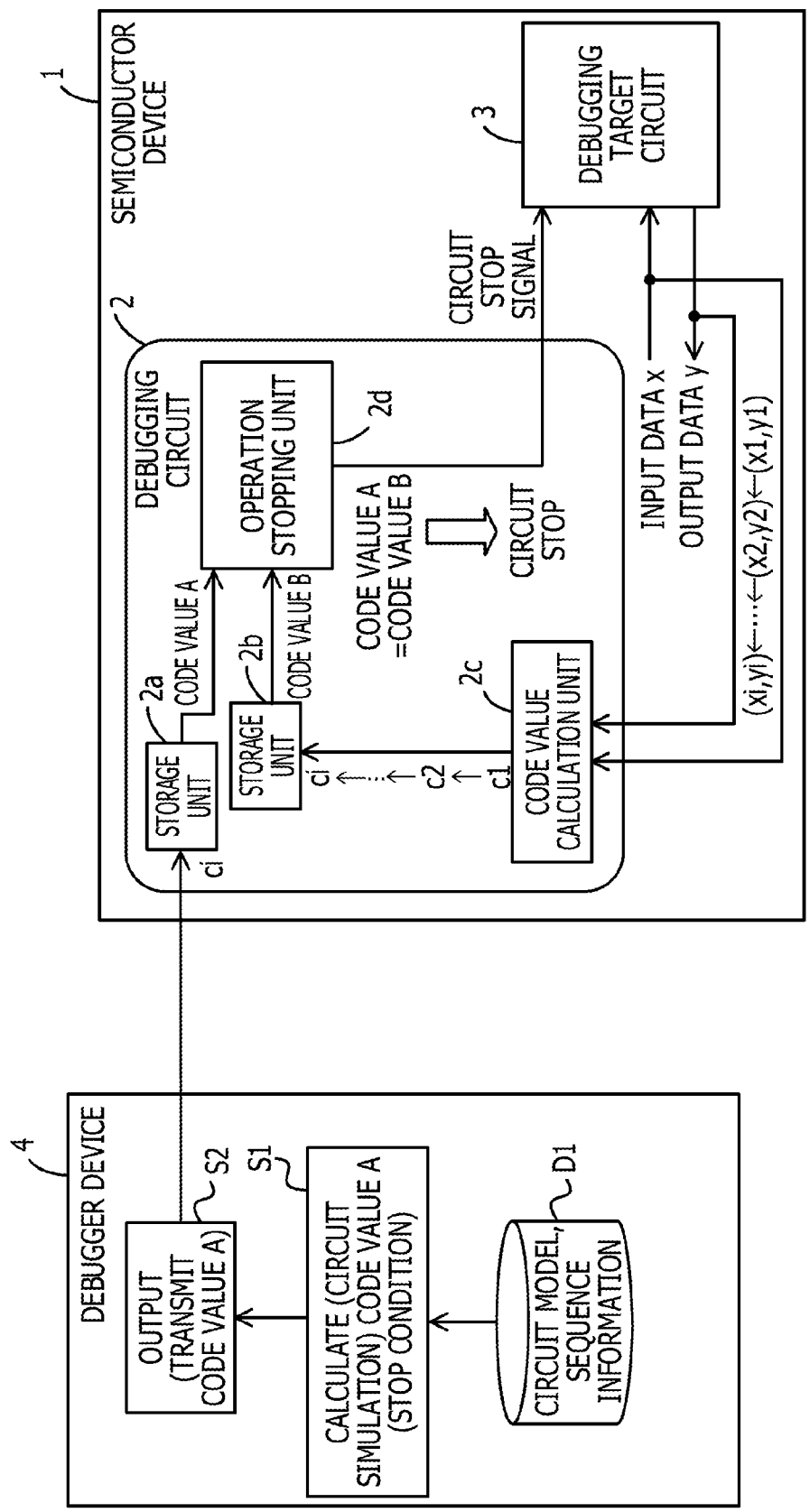
FIG. 1 is a diagram illustrating an example of a semiconductor device, a debugging circuit, and a debugger device.

FIG. 1 illustrates an example of a semiconductor device, a debugging circuit, and a debugger device.

A semiconductor device 1 includes a debugging circuit 2 and a debugging target circuit 3 which is hardware. The debugging circuit 2 is a circuit which stops an operation of the debugging target circuit 3 under a stop condition and includes storage units 2a and 2b, a code value calculation unit 2c, and an operation stopping unit 2d.

The storage unit 2a stores a code value (hereinafter, referred to as a code value "A") which indicates a stop condition of the debugging target circuit 3. The code value "A" may be calculated by an encoding method in which a value varies according to a sequence of signals related to the debugging target circuit 3. In a case where the debugging circuit 2 stops the operation of the debugging target circuit 3 at a certain sequence of signals, the certain sequence may be indicated by the code value "A" as a stop condition.

As the encoding method (encoding algorithm) in which a value varies according to a sequence of signals, for example, a Cyclic Redundancy Check (CRC), a hamming code, an Message Digest Algorithm (MD) 5, or an Secure Hash Algorithm (SHA)-1 may be used. The code value "A" is calculated by the debugger device 4.

The storage unit 2b stores a code value (hereinafter, referred to as a code value "B") calculated in the code value calculation unit 2c within the debugging circuit 2. The code value calculation unit 2c calculates the code value "B" by the same encoding method as that used for calculating the code value "A" based on a signal related to the debugging target circuit 3 each time when the signal is changed.

When the code value "A" and the code value "B" are identical to each other, the operation stopping unit 2d stops the operation of the debugging target circuit 3. When the code values "A" and "B" are identical to each other, for example, the operation stopping unit 2d stops the operation of the debugging target circuit 3 in such a way that the supply of a clock signal to the debugging target circuit 3 is stopped by the circuit stop signal. The operation stopping unit 2d blocks the data input to the debugging target circuit 3 and the data output from the debugging target circuit 3 such that the debugging target circuit 3 may be handled as if being stopped.

The debugger device 4 communicates with the semiconductor device 1 to perform debugging. The debugger device 4 calculates the code value "A" based on a circuit model formed by modeling the debugging target circuit 3 and data D1 containing information of the sequence of signals which stops the operation of the debugging target circuit 3 (Operation S1). The debugger device 4 updates the code value by the encoding method each time when the signal is changed in a specific sequence included in the data D1 using, for example, a circuit simulation, and sets a code value obtained when the sequence is ended as the code value "A". The debugger device 4 outputs (transmits) the code value "A" to the semiconductor device 1 (Operation S2).

When an input data "x" and an output data "y" are changed in a sequence of, for example, (x1, y1), (x2, y2), ..., (xi, yi) in the debugging target circuit 3, the operation of the debugging target circuit 3 may be stopped.

The debugger device 4 performs a circuit simulation on the circuit model of the debugging target circuit 3 and computes the code value "A" at the time when the signal is changed in the above sequence. For example, a variable "ci" is calculated as the code value "A". The debugger device 4 transmits the "ci" as the code value "A". The debugging circuit 2 of the semiconductor device 1 receives and stores the "ci" in the storage unit 2a.

The debugging circuit 2 detects the change in signal of the debugging target circuit 3. The code value calculation unit 2c updates the code value "B" each time when the input data "x" or the output data "y" is changed in FIG. 1.

For example, as illustrated in FIG. 1, when the input data "x" or the output data "y" of the debugging target circuit 3 is changed in the sequence of (x1, y1), (x2, y2), ..., (xi, yi) and the code value "B" is changed in the sequence of "c1", "c2", ..., "ci", the code value "B" is identical to the code value "A".

In this case, the operation stopping unit 2d stops the operation of the debugging target circuit 3. Thereafter, for example, a debugging operation such as checking the signal of each unit of the debugging target circuit 3 may be performed by the debugger device 4.

In the semiconductor device 1, the debugging circuit 2, and the debugger device 4, the stop condition is obtained in advance by a code value which varies according to the signal sequence of the debugging target circuit 3, and stored in the storage unit 2a. The debugging circuit 2 stops the debugging target circuit 3 when the stored code value is identical to the obtained code value each time when the signal is changed. The code values described above may be used to make the debugging target circuit 3 to stop easily regardless of hardware constraints, such that work efficiency may be improved.

Even when a complicated sequence is set as the stop condition, since a stop condition is represented by the code value, the capacity of the storage units 2a and 2b may be small. Accordingly, the circuit area of each of the debugging circuit 2 and the semiconductor device 1 may be reduced.

When it is intended to change the stop condition, the debugger device 4 may have only to calculate a code value indicating a new stop condition and the storage unit 2a may have only to store the calculated code value. Therefore, re-implementation of a circuit may not be performed.

Figure 2:
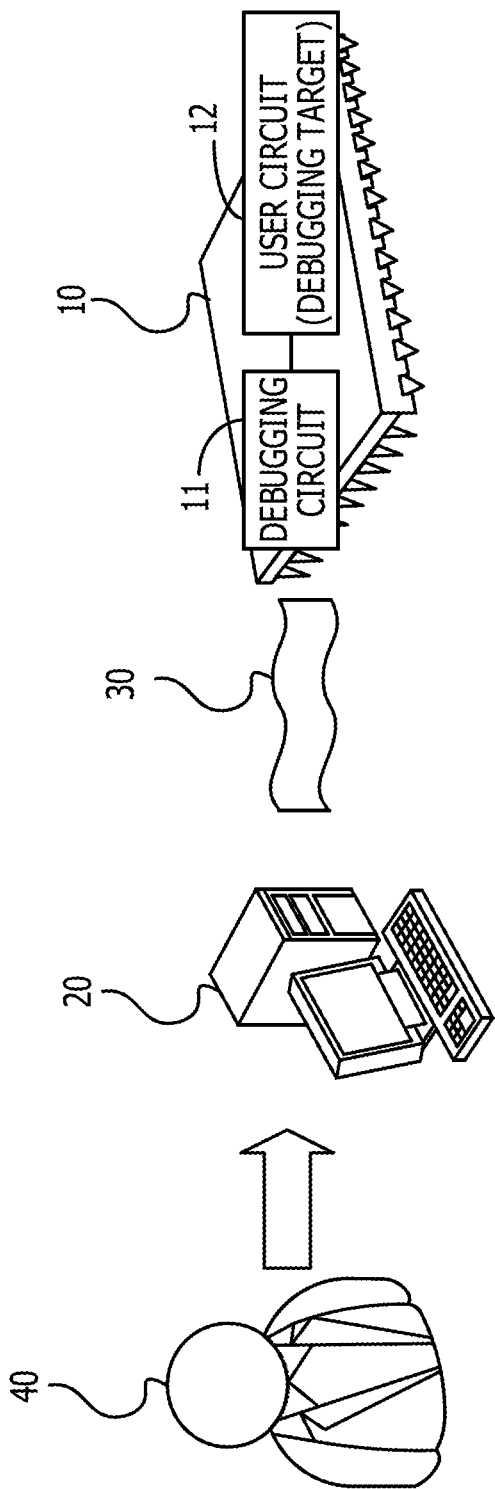
FIG. 2 is a diagram illustrating an exemplary debugging system.

FIG. 2 is a diagram illustrating an exemplary debugging system.

The debugging system illustrated in FIG. 2 includes a semiconductor device 10 and a debugger device 20 that are coupled with each other via a communication cable 30. The semiconductor device 10 and the debugger device 20 may communicate with each other wirelessly.

The semiconductor device 10 may be, for example, SoC (System on Chip) and includes a debugging circuit 11 and a user circuit 12 which corresponds to a debugging target. The debugger device 20 may be, for example, a computer, and is manipulated by an operator 40 and communicated with the semiconductor device 10 through the communication cable 30 to perform debugging.

Figure 3:
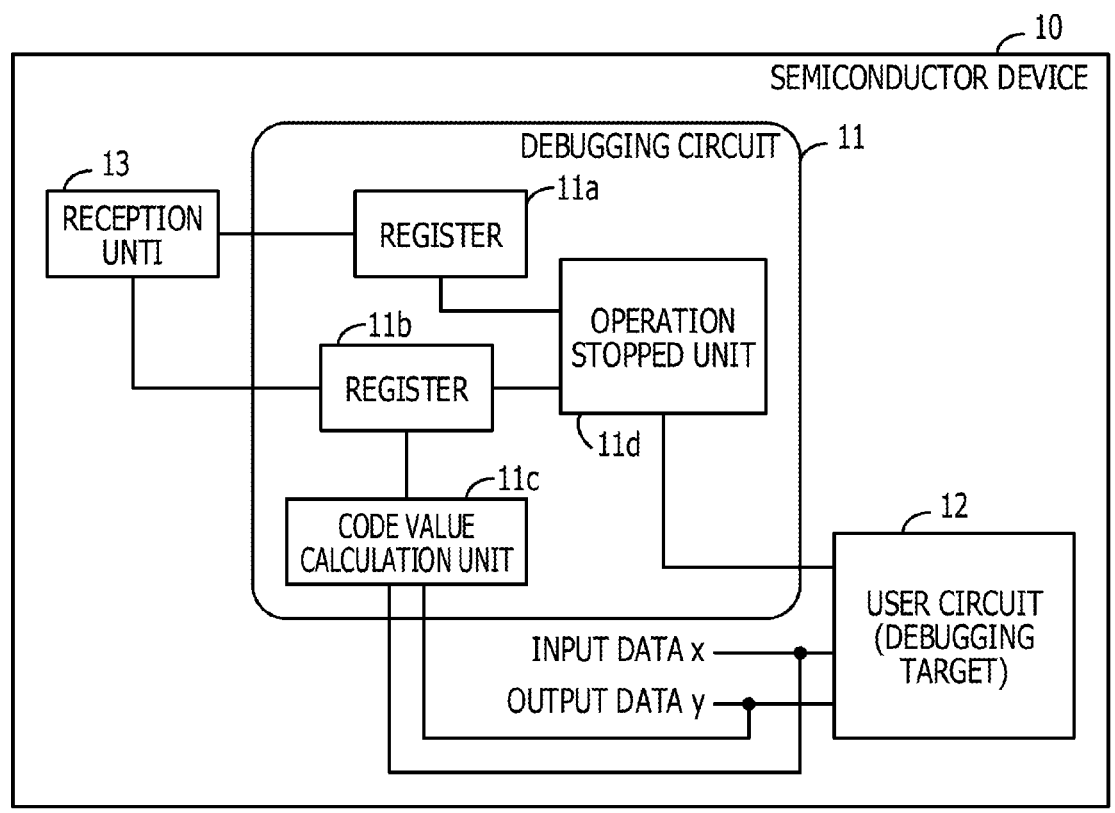
FIG. 3 is a diagram illustrating an exemplary semiconductor device.

FIG. 3 is a diagram illustrating an exemplary semiconductor device. In addition to the debugging circuit 11 and the user circuit 12, the semiconductor device 10 includes a reception unit 13 which receives data transmitted through the communication cable 30 from the debugger device 20.

The debugging circuit 11 includes registers 11a and 11b, a code value calculation unit 11c, and an operation stopping unit 11d. The register 11a stores the code value which indicates the stop condition transmitted from the debugger device 20 and received in the reception unit 13.

The register 11b stores the code value calculated by the code value calculation unit 11c. Further, the register 11b stores an initial value of the code value transmitted from the debugger device 20 and received in the reception unit 13. Each time when the signal related to the user circuit 12 is changed, the code value calculation unit 11c calculates the code value which is changed according to the sequence of the signal by using the same encoding method as the encoding method used for calculating the code value by the debugger device 20. For example, the CRC, the hamming code, the MD5, or the SHA-1 may be used as the encoding method.

Figure 4:
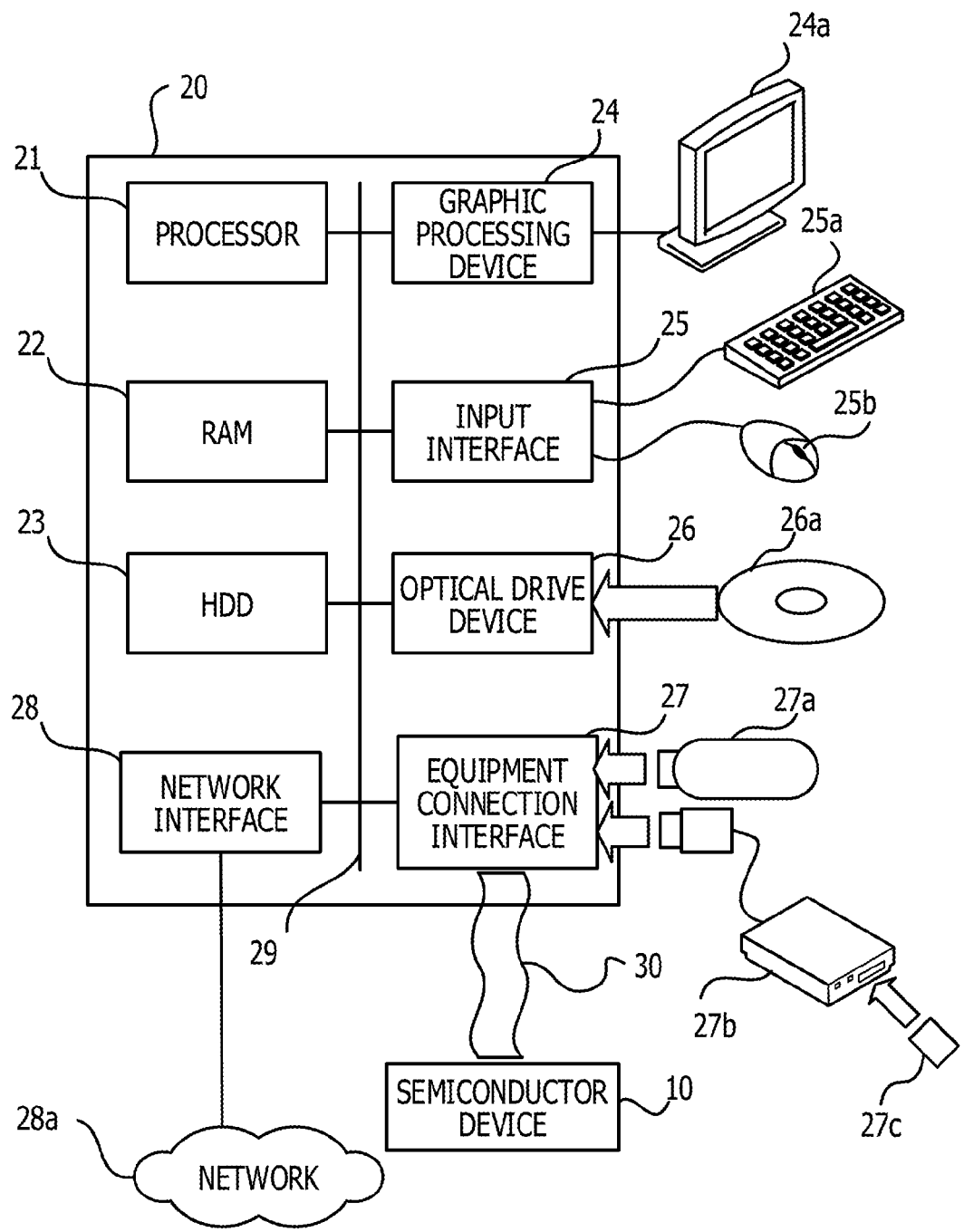
FIG. 4 is a diagram illustrating an example of hardware of a debugger device.

When both of the code values stored in the register 11a and register 11b are identical to each other, the operation stopping unit 11d stops the operation of the user circuit 12 which corresponds to the debugging target. FIG. 4 is a diagram illustrating an example of hardware of a debugger device.

The debugger device 20 may be a computer and is controlled by a processor 21 in its entirety. A RAM 22 and a plurality of peripheral equipments are coupled to the processor 21 through a bus 29. The processor 21 may be a multiprocessor. The processor 21 may be, for example, a CPU, a Micro Processing Unit (MPU), a Digital Signal Processor (DSP), an Application Specific Integrated Circuit (ASIC), or a Programmable Logic Device (PLD). The processor 21 may be a combination of two or more of the CPU, the MPU, the DSP, the ASIC, and the PLD.

The RAM 22 is used as a primary storage device of the debugger device 20. In the RAM 22, at least a portion of an OS (Operating System) program or an application program executed by the processor 21 is temporarily stored. Further, various data used for a process to be executed by the processor 21 are stored in the RAM 22.

The peripheral equipment connected to the bus 29 may include a Hard Disk Drive (HDD) 23, a graphic processing device 24, an input interface 25, an optical drive device 26, an equipment connection interface 27, or a network interface 28.

The HDD 23 performs writing and reading data into and from a built-in disk magnetically. The HDD 23 may be used as an auxiliary storage device of the debugger device 20. The OS program, the application program such as circuit simulation software, and various data are stored in the HDD 23. A semiconductor storage device such as a flash memory may be used as the auxiliary storage device.

The graphic processing device 24 is coupled with a monitor 24a. The graphic processing device 24 displays an image such as a debugging result on a screen of the monitor 24a according to an instruction from the processor 21. The monitor 24a may include, for example, a display device using a CRT (Cathode Ray Tube) or a liquid crystal display device (LCD).

The input interface 25 is coupled with a keyboard 25a and a mouse 105b. The input interface 25 transmits the signal sent from the keyboard 25a or the mouse 25b to the processor 21. The mouse 25b may be an example of a pointing device and different types of the pointing devices may be used instead. The different types of the pointing devices may include, for example, a touch panel, a tablet, a touch pad and a track ball.

The optical drive device 26 performs reading-out of data recorded in the optical disk 26a using, for example, laser light. The optical disk 26a is a portable recording medium in which data is recorded to allow data to be read out by reflection of light. The optical disk 26a may include, for example, a DVD (Digital Versatile Disc), a DVD-RAM, a CD-ROM (Compact Disc Read Only Memory) or a CD-R (Recordable)/RW (ReWritable).

The equipment connection interface 27 may be a communication interface for coupling the peripheral equipment to the debugger device 20. For example, a memory device 27a or a memory reader/writer 27b may be coupled to the equipment connection interface 27. The memory device 27a may be a recording medium equipped with a function for communicating with the equipment connection interface 27. The memory reader/writer 27b writes data into a memory card 27c or reads data from the memory card 27c. The memory card 27c is, for example, a card type recording medium.

The equipment connection interface 27 is coupled with the semiconductor device 10 through the communication cable 30. The network interface 28 is coupled with a network 28a. The network interface 28 transmits and receives data to and from other computer or communication equipment through the network 28a.

The debugger device 4 illustrated in FIG. 1 may also include a hardware similar to the hardware of the debugger device 20 illustrated in FIG. 4.

The debugger device 20 executes a program recorded in, for example, the computer-readable recording medium. The program in which processing contents to be executed by the debugger device 20 are described may be recorded into various recording media. For example, the program to be executed by the debugger device 20 may be stored in the HDD 23. The processor 21 loads at least a portion of the program stored in the HDD 23 onto the RAM 22 and executes the program. Further, the program to be executed by the debugger device 20 may be recorded in the portable recording medium such as the optical disk 26a, the memory device 27a, or the memory card 27c. The program stored in the portable recording medium may be executed after being installed on the HDD 23 by, for example, a control from the processor 21. The processor 21 may directly read the program from the portable recording medium to be executed.

Figure 5:
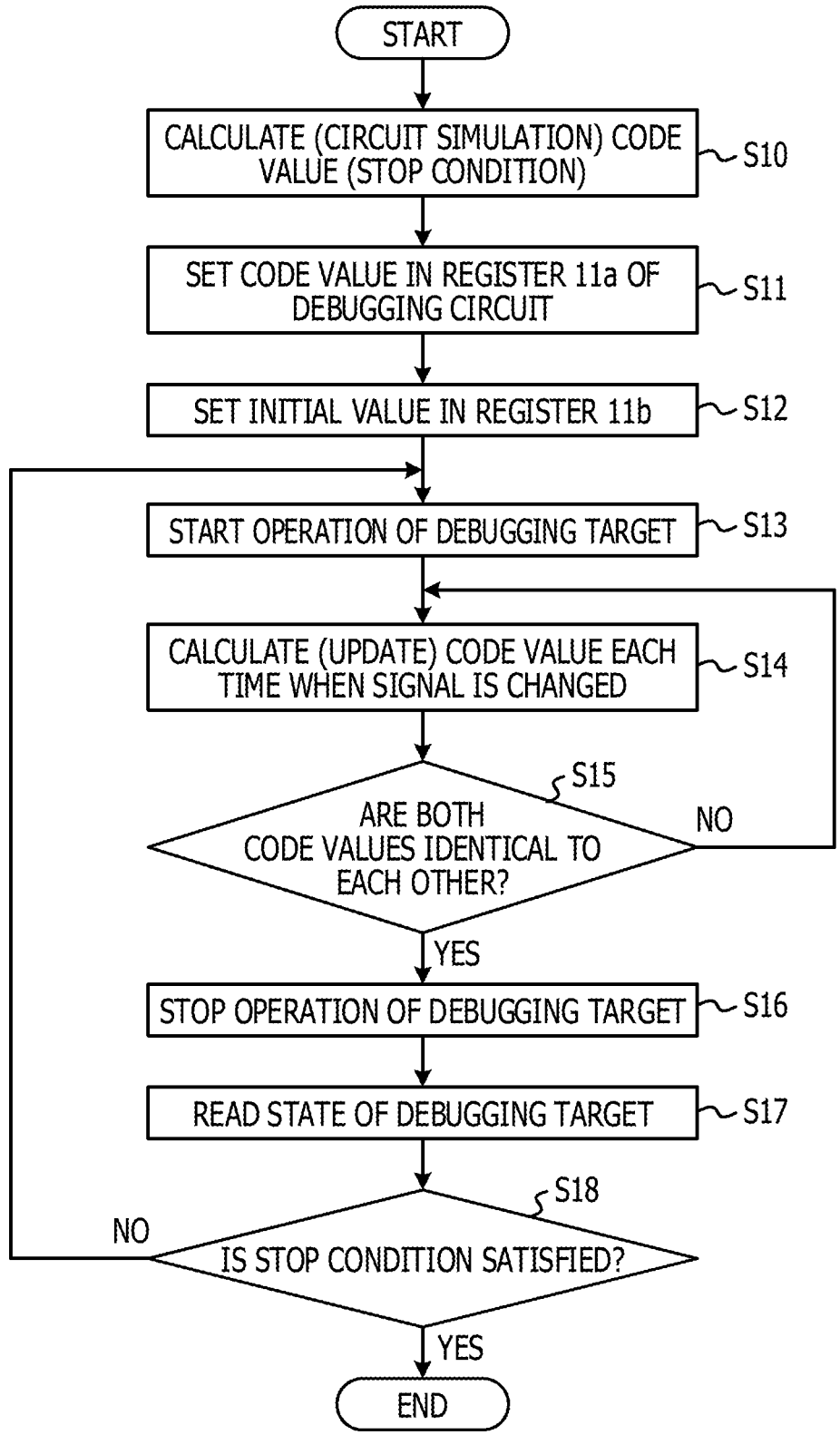
FIG. 5 is a diagram illustrating an example of a debugging method.

FIG. 5 illustrates an example of a debugging method.

The debugger device 4 performs a circuit simulation on a circuit model, which is formed by modeling, for example, a user circuit 12 that performs an operation similar to the operation of the user circuit 12 which is a debugging target, by software, and calculates a code value indicating a stop condition of the user circuit 12 (Operation S10).

FIG. 6 is a diagram illustrating an example of a debugging target. In FIG. 6, descriptions on a circuit model of a user circuit are illustrated. In FIG. 6, an example of the circuit model described in a Verilog HDL (Hardware Description Language) is illustrated. FIG. 6 illustrates a clock signal "ck" and a 16-bit input data "x" that are input to the circuit model, a 16-bit output data "y" output from the circuit model, and 1-bit signal "s" as the signal which indicates an internal state of the circuit model.

The output data "y" becomes 0 (zero) when a value of the signal "s" is 0, and becomes a value obtained by multiplying the input data "x" by 2 (two) when the value of the signal "s" is 1 (one) (see, e.g., the fourth line in the description of FIG. 6). The processing from the sixth line to the tenth line is performed synchronously with the rising of the clock signal "ck". Descriptions of the sixth line to the tenth line indicates that in a case where the value of the signal "s" is 0 (zero), the signal "s" transits from 0 to 1 (one) when the input data "x" is "16'h0010" and in a case where the value of the signal "s" is 1 (one), the signal "s" transits from 1 to 0 (one) when the input data "x" is "16'h0030".

Figure 7:
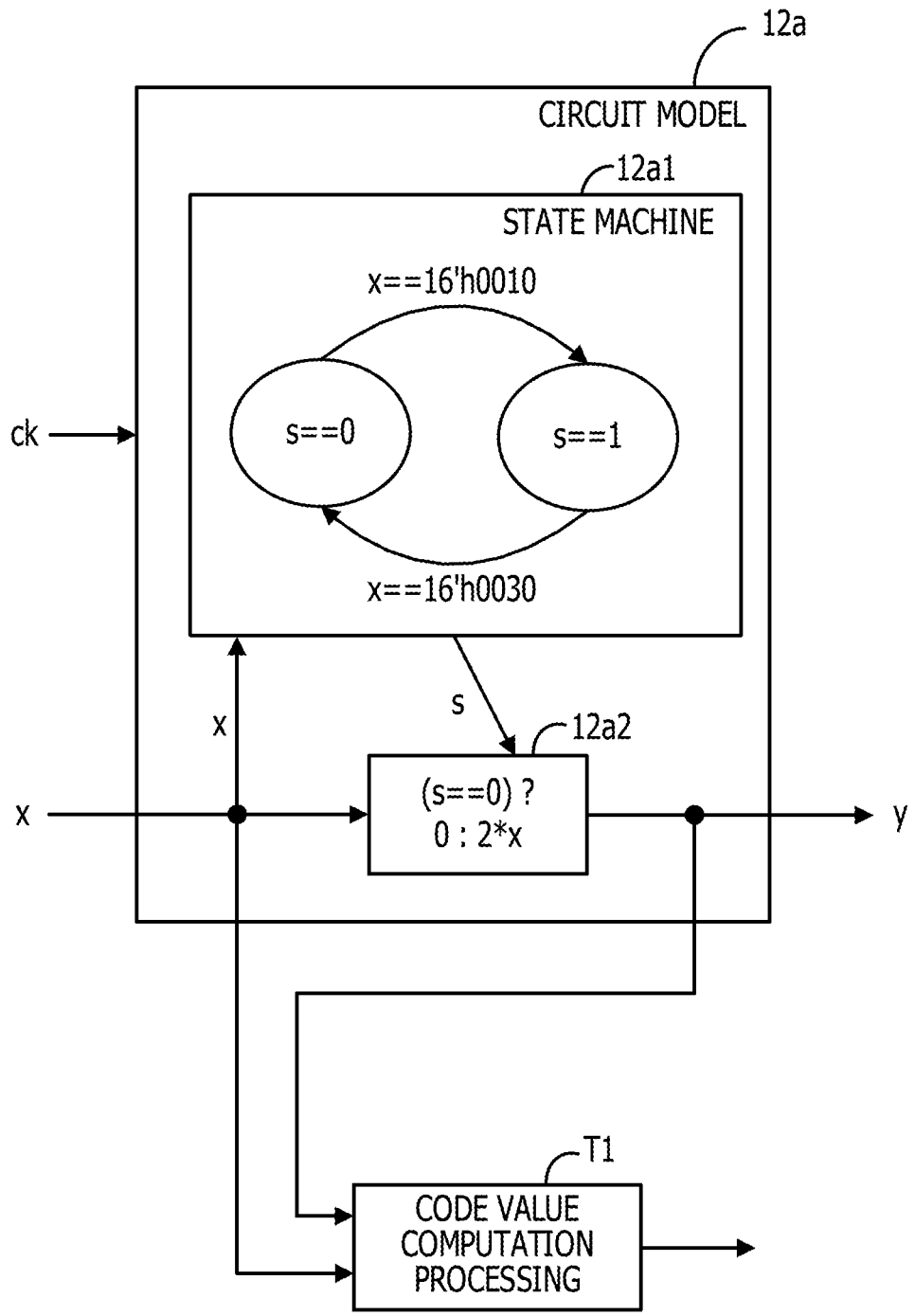
FIG. 7 is a diagram illustrating an example of a functional block of a circuit model.

In FIG. 6, a breakpoint is set in the timing at which the signal "s" transits to 0. The breakpoint may be set by, for example, an operator 40. FIG. 7 illustrates an example of a functional block of a circuit model. A circuit model illustrated in FIG. 7 may be the circuit model illustrated in FIG. 6.

A circuit model 12a includes a state machine 12a1 and a function unit 12a2. The state machine 12a1 makes the transition of the signal "s" from 0 to 1 or vice versa based on the input data "x" and the value of the signal "s" which indicates the internal state of the circuit model 12a.

The function unit 12a2 sets the output data "y" as 0 (zero) when the value of signal "s" is 0 and sets the output data "y" as a value obtained by multiplying the input data "x" by 2 when the value of signal "s" is 1, based on the value of signal "s".

A processor 21 of the debugger device 20 executes the circuit model 12a by the circuit simulation, for example, the Register Transfer Level (RTL) simulation. The circuit simulation is set to be stopped at the breakpoint illustrated in FIG. 6. The processor 21 performs a code value computation processing T1 based on the input data "x" and the output data "y" at the time of performing the circuit simulation.

For example, a sequence of the input data "x" of the circuit model 12a may be "16'h0010", "16'h0020", "16'h0030", and "16'h0040" as described in this order. For example, the processor 21 of the debugger device 20 may compute a code value (CRC value) by performing the CRC32 stipulated at the IEEE (Institute of Electrical and Electronics Engineers) 802.3 as the code value computation processing T1.

FIG. 8 illustrates an example of a stop condition. In FIG. 8, execution results of the circuit model, examples of the calculated CRC values, and determination results of whether the stop condition is satisfied or not are listed. In an initial state, the value of signal "s" is 0, and a CRC value based on the input data "x" and the output data "y" is "32'h00000000". Since this timing does not correspond to the breakpoint, the stop condition is not satisfied.

When the value of signal "s" is in a state of 0 (zero) and the input data "x" becomes "16'h0010", the output data "y" becomes "16'h0000" by the processing performed in the function unit 12a2. In this case, the CRC value is updated and becomes "32'h715d8883" as illustrated in FIG. 8. Also, in this case, the stop condition is not satisfied.

When the input data "x" becomes "16'h0010" and the clock signal "ck" rises, the value of the signal "s" becomes 1 (one) by the processing performed in the state machine 12a1. When the value of signal "s" is in a state of 1 and the input data "x" becomes "16'h0020", the output data "y" becomes twice the input data "x", for example, "16'h0040" by the processing performed in the function unit 12a2. In this case, the CRC value is updated and becomes a value of "32'h49d20e79". Also, in this case, the stop condition is not satisfied.

When the value of the signal "s" is in a state of 1 (one) and the input data "x" becomes "16'h0030", the output data "y" becomes twice the input data "x", for example, "16'h0060" by the processing performed in the function unit 12a2. In this case, the CRC value is updated and becomes a value of "32'h1435d0af". Since this state corresponds to a timing at which the breakpoint, where the value of signal "s" is 1 and the input data "x" is "16'h0030", is set, the stop condition is satisfied, as illustrated in FIG. 6.

In this case, when the clock signal "ck" rises, the value of signal "s" becomes 0 (zero) by the processing performed in the state machine 12a1. When the value of signal "s" is in a state of 0 (zero) and the input data "x" becomes "16'h0040", the output data "y" becomes "16'h0000" by the processing performed in the function unit 12a2. In this case, the CRC value is updated and becomes a value of "32'h9a3aad89". Further, in this case, the stop condition is not satisfied.

As described above, the code value calculation processing at Operation S10 is performed. The debugger device 20 transmits the CRC value of "32'h1435d0af" calculated at the time when the stop condition is satisfied to the semiconductor device 10.

The semiconductor device 10 receives the code value transmitted from the debugger device 20 in the reception unit 13 and sets (stores) the code value in the register 11a of the debugging circuit 11 (Operation S11). The debugger device 20 transmits the initial value of "32'h00000000" to be set in the register 11b to the semiconductor device 10.

The semiconductor device 10 receives the initial value transmitted from the debugger device 20 in the reception unit 13 and sets (stores) the initial value in the register 11b of the debugging circuit 11 (Operation S12). Thereafter, the operation stopping unit 11d of the debugging circuit 11 causes the user circuit 12 of the debugging target to start an operation (Operation S13). For example, the operation stopping unit 11d turns the supply of the clock signal to the user circuit 12 ON such that the user circuit 12 starts the operation.

After the operation of the user circuit 12 is started, the code value calculation unit 11c of the debugging circuit 11 calculates the code value each time when the input data "x" or the output data "y" of the user circuit 12 is changed and updates the code value stored in the register 11b (Operation S14).

The code value calculated by the processing at Operation S14 is calculated by an encoding method which is substantially the same encoding method used for the code value calculated by the debugger device 20. When the debugger device 20 computes the code value by the CRC 32, the code value is similarly computed by the CRC 32 also in the code value calculation unit 11c of the debugging circuit 11.

When the code value stored in the register 11b is updated, the operation stopping unit 11d determines whether both code values stored in the registers 11a and 11b are identical to each other (Operation S15). When it is determined that both code values differ from each other, the processing starting from Operation S14 is repeated.

When both code values are identical to each other, the operation stopping unit 11d stops the operation of the user circuit 12 which corresponds to the debugging target (Operation S16). For example, the CRC value of "32'h1435d0af" calculated by the debugger device 20 at the time when the input data "x" and the output data "y" of the circuit model 12a have transited in the sequence illustrated in FIG. 8 may be stored in the register 11a.

When the input data "x" and the output data "y" of the circuit model 12a have transited in the sequence illustrated in FIG. 8 in the user circuit 12 of the semiconductor device 10 as well, the CRC value calculated in the code value calculation unit 11c becomes a value of "32'h1435d0af" to be identical to the CRC value stored in the register 11a. In this case, the operation stopping unit 11d sets the circuit stop signal to be supplied to the user circuit 12 to "1" and stops the operation of the user circuit 12 by, for example, turning the supply of the clock signal to the user circuit 12 OFF.

Thereafter, reading of the state of the user circuit 12 which is the debugging target of the semiconductor device 10 is performed by manipulation of the operator 40 for the debugger device 20 (Operation S17). In the processing at Operation S17, for example, a boundary scan circuit within the semiconductor device 10 may be utilized to perform an operation such as reading the state of the user circuit 12 such as, for example, the input data "x", the output data "y", or the signal "s" indicating the internal state.

Next, the debugger device 20 determines whether the stop condition is actually satisfied from the read state of the user circuit 12 (Operation S18). For example, the debugger device 20 determines whether the values of the input data "x", the signal "s", and the output data "y" that satisfy the stop condition illustrated in FIG. 8 are identical to the signals read from the semiconductor device 10. When it is determined that the values and the signal are identical to each other, the debugger device 20 determines that the stop condition is satisfied. Accordingly, the debugging process is ended. When it is determined that the values and the signals are not identical to each other, the debugger device 20 causes the debugging circuit 11 of the semiconductor device 10 to resume the operation of the user circuit 12. The processing starting from Operation S13 is repeated.

After the processing at Operation S18, the operator 40 causes the debugger device 20 to change the signal of the user circuit 12 within the semiconductor device 10 and causes the debugger device 20 and the semiconductor device 10 to repeat the processing starting from Operation S10 again.

The sequence of the processing described above are not limited thereto and the processing such as setting of the initial value to the register 11b may be performed before the processing at Operation S10. The same effect as in the semiconductor device 1, the debugging circuit 2, and the debugger device 4 illustrated in FIG. 1 may be obtained in the semiconductor device 10, the debugging circuit 11, and the debugger device 20.

The determination at Operation S18 is performed such that a situation where the code values are identical to each other even though the stop condition is not actually satisfied and the signal at the time when the user circuit 12 is stopped at erroneous timing is presented to the operator 40 is reduced.

The operation stopping unit 11d of the debugging circuit 11 may stop the operation of the user circuit 12 by, for example, turning the supply of the clock signal to the user circuit 12 OFF.

Figure 9:
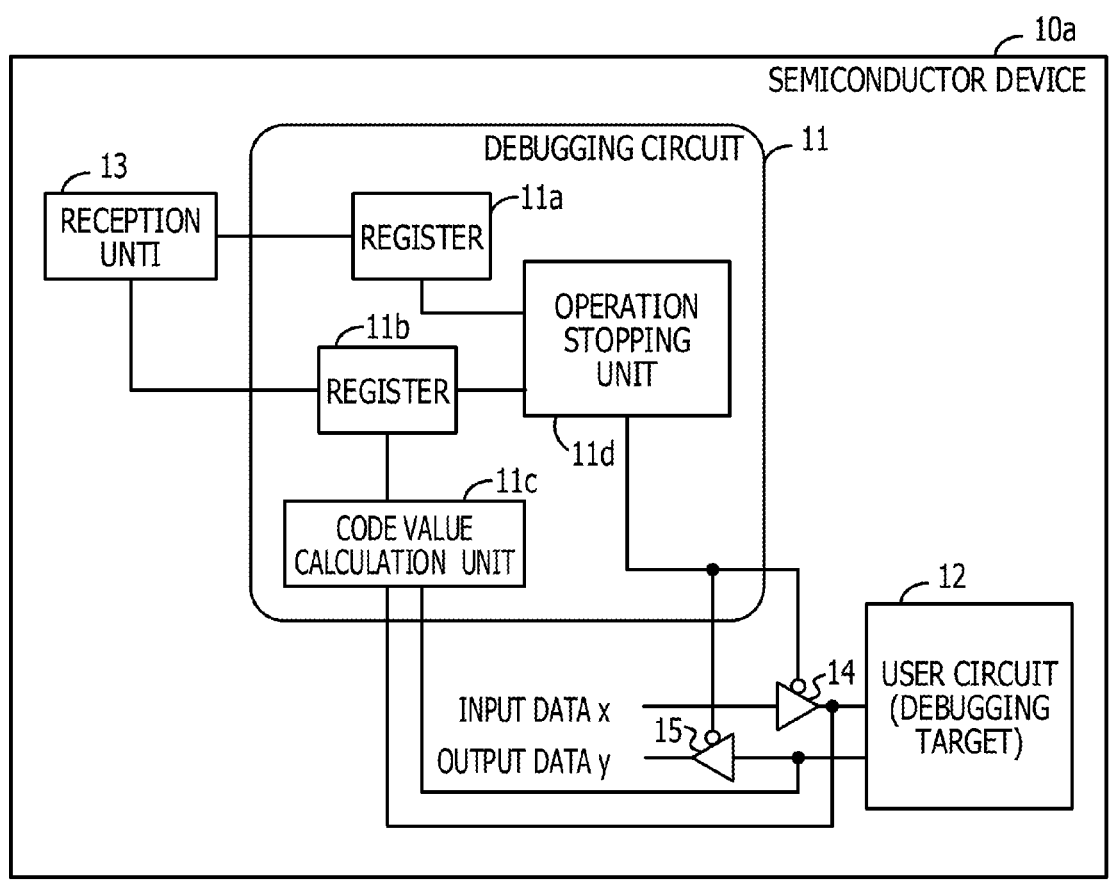
FIG. 9 is a diagram illustrating another exemplary semiconductor device.

FIG. 9 is a diagram illustrating another exemplary semiconductor device. In FIG. 9, the same reference numerals may be given to constitutional elements similar to the constitutional elements of the semiconductor device 10 illustrated in FIG. 3 and descriptions thereof may be omitted or reduced.

A semiconductor device 10a illustrated in FIG. 9 includes an input blocking unit 14 coupled to an input side of the user circuit 12 and an output blocking unit 15 coupled to an output side of the user circuit 12. When a signal to stop the operation of the user circuit 12, for example, a circuit stop signal of "1" (one) is received from the operation stopping unit 11d, the input blocking unit 14 outputs a fixed value, for example, 0 (zero) regardless of the value of the input data "x".

When a signal to stop the operation of the user circuit 12, for example, a circuit stop signal of "1" (one) is received from the operation stopping unit 11d, the output blocking unit 15 outputs a fixed value, for example, 0 (zero) regardless of the value of the output data "y".

When the user circuit 12 is a circuit which operates in a handshake fashion, the operation of the user circuit 12 is stopped by blocking the input or output. Therefore, the input and output is blocked by the input blocking unit 14 illustrated in FIG. 9 and the output blocking unit 15 illustrated in FIG. 9, respectively, to stop the operation of the user circuit 12 such that the increase of the amount of a circuit may be reduced. The effect similar to the effect of the semiconductor device 10 and the debugging circuit 11 illustrated in FIG. 3 may be obtained.

Figure 10:
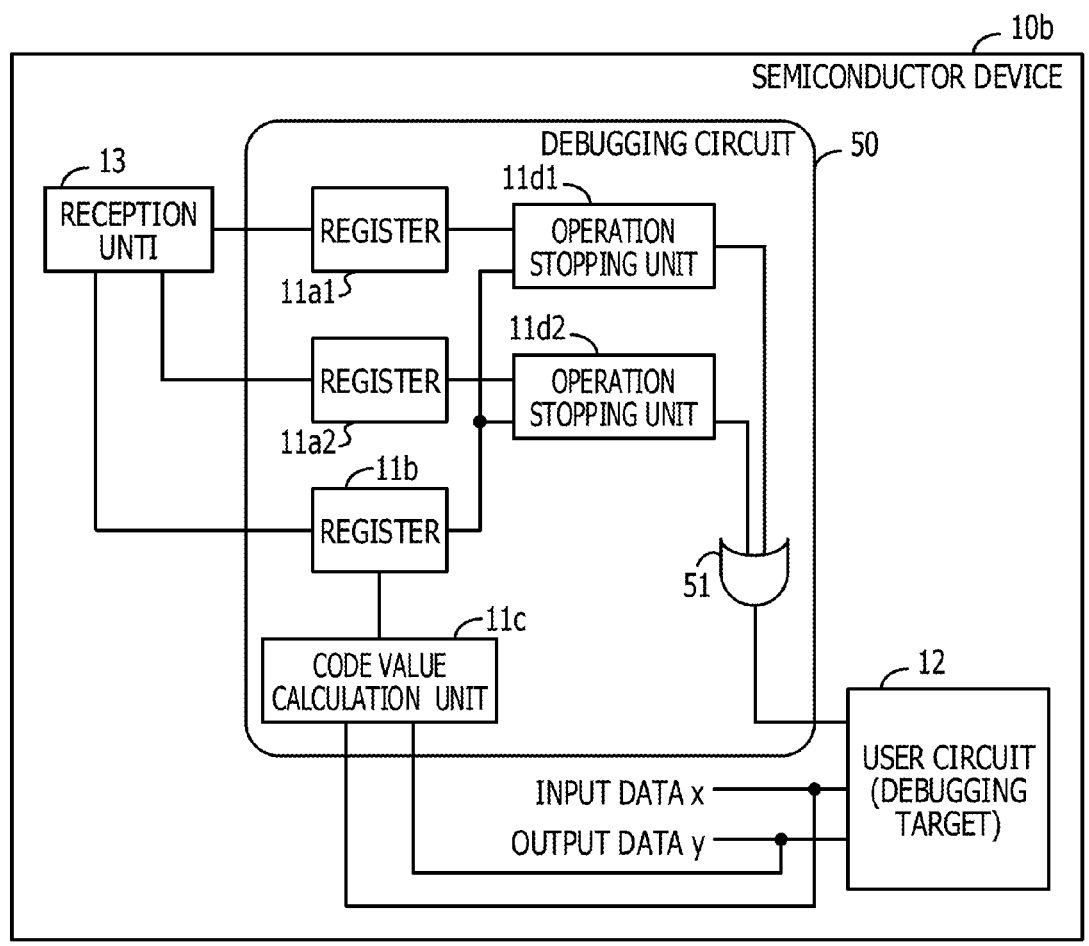
FIG. 10 is a diagram illustrating still another exemplary semiconductor device.

FIG. 10 is a diagram illustrating another exemplary semiconductor device. In FIG. 10, the same reference numerals may be given to constitutional elements similar to the constitutional elements of the semiconductor device 10 illustrated in FIG. 3 and descriptions thereof may be omitted or reduced.

In a semiconductor device 10b, a debugging circuit 50 includes registers 11a1 and 11a2 that store the code values corresponding to a plurality of stop conditions. The code values stored in the registers 11a1 and 11a2 may be code values calculated by, for example, the processing at Operation S10 illustrated in FIG. 5 performed by the debugger device 20. For example, a plurality of code values are calculated for a plurality of sequences of signals of the circuit model 12a until the sequences of signals reach a plurality of breakpoints, and the plurality of calculated code values are transmitted to the semiconductor device 10b and stored in the registers 11a1 and 11a2.

The debugging circuit 50 includes operation stopping units 11d1 and 11d2, and an OR circuit 51. The operation stopping unit 11d1 compares the code value stored in the register 11a1 and the code value stored in the register 11b, and stops the operation of the user circuit 12 when both code values are identical to each other. In the semiconductor device 10b illustrated in FIG. 10, the operation stopping unit 11d1 may output the circuit stop signal of which value becomes 1 (one) when both code values are identical to each other.

The operation stopping unit 11d2 compares the code value stored in the register 11a2 and the code value stored in the register 11b, and stops the operation of the user circuit 12 when both code values are identical to each other. The operation stopping unit 11d2 may output the circuit stop signal of which value becomes 1 (one) when both code values are identical to each other.

The OR circuit 51 receives the circuit stop signal outputted from the operation stopping units 11d1 and 11d2 as inputs, performs a logical OR operation on the inputs, and outputs the result of the logical OR operation to the user circuit 12. When the value of any one of the circuit stop signals output from the operation stopping units 11d1 and 11d2 is 1 (one), the OR circuit 51 outputs 1. Therefore, the operation of the user circuit 12 is stopped.

The effect similar to the effect of the semiconductor device 10 and the debugging circuit 11 illustrated in FIG. 3 may be obtained in the semiconductor device 10b and the debugging circuit 50 illustrated in FIG. 10. The user circuit 12 may be stopped under the complicated condition. Since the stop condition is indicated not by a plurality of input data "x" or a plurality of output data "y" but by the code value, the increase of the amount of a circuit may be reduced even when a plurality of stop conditions are set.

The number of code values indicating the stop conditions received from the debugger device 20 may be two, or three or more. In this case, the registers and the operation stopping units may be prepared to be corresponded to the number of code values.

The number of operation stopping units may be two or one with respect to two code values indicating the stop conditions. In this case, two code values indicating two stop conditions are sequentially compared with the code value stored in the register 11b and the circuit stop signal may be output at the time when the code value indicating the stop condition is identical to the code value stored in the register 11b in any one comparison for the code values.

The semiconductor device 10b may be combined with the semiconductor device 10a illustrated in FIG. 9. In this case, the output terminal of the OR circuit 51 may be coupled with the input blocking unit 14 and the output blocking unit 15.

The code value may be calculated based on, for example, either both input data and output data or any one of the input data and the output data of the debugging target circuit. The code value may be calculated based on the sequence of the internal signals of the debugging target circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A debugging circuit comprising:
    a storage configured to store a first code value which is obtained in advance by performing an encoding method in which a value is calculated by a temporal sequence input to and output from a debugging target circuit to be debugged, and indicates a stop condition of the debugging target circuit;
    a code value calculator configured to calculate a second code value by the encoding method using a combination of an input signal input to the debugging target circuit and an output signal from the debugging target circuit when debugging the debugging target circuit each time when one of the input signal and the output signal in the combination is changed; and
    an operation stopper configured to stop an operation of the debugging target circuit when the first code value and the second code value are identical to each other.

2. The debugging circuit according to claim 1, wherein, when the first code value includes code values indicating a plurality of stop conditions, the storage includes a plurality of sub storages corresponding to the respective code values.

3. The debugging circuit according to claim 2, wherein the operation stopper includes a plurality of sub operation stoppers provided to be corresponded to the plurality of sub storages, and the plurality of sub operation stoppers are configured to stop the operation of the debugging target circuit when the second code value is identical to one of the code values.

4. The debugging circuit according to claim 1, wherein the operation stopper is configured to block inputting of an input data to the debugging target circuit or outputting of an output data from the debugging target circuit.

5. The debugging circuit according to claim 1, wherein the encoding method is one of a CRC (Cyclic Redundancy Check), a hamming code, an MD (Message Digest Algorithm) 5, and an SHA (Secure Hash Algorithm)-1.

6. The debugging circuit according to claim 1, wherein the debugging target circuit is included in a semiconductor device.

7. A debugger device comprising:
a memory configured to store a simulation program; and
a processor configured to execute the simulation program, wherein the processor performs operations to:
   execute the simulation program for a circuit model which is formed by modeling a debugging target circuit to be debugged;
   calculate, in advance, a first code value indicating a stop condition of the debugging target circuit obtained by performing an encoding method in which a value is calculated by a temporal sequence input to and output from the debugging target circuit; and
   output the first code value to a circuit which debugs the debugging target circuit, calculates a second code value by the encoding method using a combination of an input signal input to the debugging target circuit and an output signal from the debugging target circuit when debugging the debugging target circuit each time when one of the input signal and the output signal in the combination is changed and stops an operation of the debugging target circuit when the first code value and the second code value are identical to each other.

8. The debugger device according to claim 7, wherein, when the first code value includes code values indicating a plurality of stop conditions, the processor output the code values to a plurality of sub storages in the circuit respectively.

9. The debugger device according to claim 7, wherein the encoding method is one of a CRC (Cyclic Redundancy Check), a hamming code, an MD (Message Digest Algorithm) 5, and an SHA (Secure Hash Algorithm)-1.

10. The debugger device according to claim 7, wherein the debugging target circuit is included in a semiconductor device.

11. A debugging method comprising:
acquiring, based on a simulation by a debugger device with respect to a circuit model formed by modeling a debugging target circuit to be debugged, a first code value indicating a stop condition of the debugging target circuit and obtained by performing an encoding method in which a value is calculated by a temporal sequence input to and output from the debugging target circuit;
storing the first code value in a storage in advance;
calculating a second code value by the encoding method using a combination of an input signal input to the debugging target circuit and an output signal from the debugging target circuit when debugging the debugging target circuit each time when one of the input signal and the output signal in the combination is changed; and
stopping an operation of the debugging target circuit when the first code value and the second code value are identical to each other.

12. The debugging method according to claim 8, further comprising:
reading a state of the debugging target circuit at the time when an operation of the debugging target circuit is stopped; and
determining whether the state of the debugging target circuit satisfies the stop condition or not.

13. The debugging method according to claim 8, further comprising:
blocking inputting of an input data to the debugging target circuit or outputting of an output data from the debugging target circuit.

14. The debugging method according to claim 8, wherein the encoding method is one of a CRC (Cyclic Redundancy Check), a hamming code, an MD (Message Digest Algorithm) 5, and an SHA (Secure Hash Algorithm)-1.

15. The debugging method according to claim 8, wherein the debugging target circuit is included in a semiconductor device.

* * * * *